(12) United States Patent
Chen et al.

(10) Patent No.: US 12,431,096 B2
(45) Date of Patent: Sep. 30, 2025

(54) DISPLAY PANEL WITH GALLIUM NITRIDE-BASED LIGHT EMITTING DIODE UNITS WITH DISPLAY STATE AND INFRARED RECOGNITION STATE

(71) Applicant: ENKRIS SEMICONDUCTOR, INC., Jiangsu (CN)

(72) Inventors: Yuchao Chen, Jiangsu (CN); Kai Cheng, Jiangsu (CN)

(73) Assignee: ENKRIS SEMICONDUCTOR, INC., Jiangsu (CN)

( * ) Notice: Subject to any disclaimer, the term of this patent is extended or adjusted under 35 U.S.C. 154(b) by 73 days.

(21) Appl. No.: 18/562,195

(22) PCT Filed: Jun. 18, 2021

(86) PCT No.: PCT/CN2021/101076
§ 371 (c)(1),
(2) Date: Nov. 17, 2023

(87) PCT Pub. No.: WO2022/261980
PCT Pub. Date: Dec. 22, 2022

(65) Prior Publication Data
US 2024/0242682 A1    Jul. 18, 2024

(51) Int. Cl.
*G09G 3/3291* (2016.01)
*G09G 5/02* (2006.01)

(52) U.S. Cl.
CPC ............. *G09G 3/3291* (2013.01); *G09G 5/02* (2013.01)

(58) Field of Classification Search
None
See application file for complete search history.

(56) References Cited

U.S. PATENT DOCUMENTS 11,081,516 B2    8/2021    Wu
2009/0108757 A1*  4/2009   Lee ............... H10K 59/8791
                                              315/51

(Continued)

FOREIGN PATENT DOCUMENTS

CN        109040363 A      12/2018
CN        208654807 U       3/2019

(Continued)

OTHER PUBLICATIONS

ISA State Intellectual Property Office of the People's Republic of China, International Search Report Issued in Application No. PCT/CN2021/101076, Feb. 9, 2022, WIPO, 4 pages.

(Continued)

*Primary Examiner* — Nitin Patel
*Assistant Examiner* — Sarvesh J Nadkarni
(74) *Attorney, Agent, or Firm* — Christopher R. Carroll; The Small Patent Law Group LLC

(57) ABSTRACT

The present disclosure provides a display panel, including a display region, where the display region includes at least a first region and a second region, and the first region and the second region include first GaN-based light emitting diode (LED) units arranged in an array; where the first region and the second region include a display state and an infrared recognition state; in the display state, the first GaN-based LED units in the first region and the second region are configured to display a visible light screen; in the infrared recognition state, the first GaN-based LED units in the first region are configured for emitting infrared light, and the first GaN-based LED units in the second region are configured for sensing infrared light.

19 Claims, 4 Drawing Sheets

(56) References Cited

U.S. PATENT DOCUMENTS

| | | | |
|---|---|---|---|
| 2015/0348504 A1* | 12/2015 | Sakariya | G09G 3/2092 |
| | | | 345/82 |
| 2018/0102085 A1* | 4/2018 | Pan | G09G 3/3291 |
| 2018/0114800 A1* | 4/2018 | Pan | H10H 29/142 |
| 2018/0190615 A1* | 7/2018 | Pan | G06F 3/044 |
| 2018/0198980 A1* | 7/2018 | Takagi | G06V 40/19 |
| 2018/0269352 A1* | 9/2018 | Tian | H10H 20/823 |
| 2020/0052030 A1 | 2/2020 | Wu | |
| 2021/0296528 A1* | 9/2021 | Fujiwara | H10H 20/8252 |
| 2023/0316988 A1* | 10/2023 | Hofrichter | G09G 3/32 |
| | | | 345/55 |
| 2023/0326420 A1* | 10/2023 | Hofrichter | G09G 3/3453 |
| | | | 345/84 |

FOREIGN PATENT DOCUMENTS

| | | |
|---|---|---|
| CN | 110600597 A | 12/2019 |
| CN | 112510024 A | 3/2021 |

OTHER PUBLICATIONS

ISA State Intellectual Property Office of the People's Republic of China, Written Opinion of the International Searching Authority Issued in Application No. PCT/CN2021/101076, Feb. 9, 2022, WIPO, 3 pages.

\* cited by examiner

DISPLAY PANEL WITH GALLIUM NITRIDE-BASED LIGHT EMITTING DIODE UNITS WITH DISPLAY STATE AND INFRARED RECOGNITION STATE

CROSS REFERENCE TO RELATED APPLICATIONS

This application is a National Phase of International Application No. PCT/CN2021/101076, filed on Jun. 18, 2021, the entire contents of which are incorporated herein by reference in their entireties.

TECHNICAL FIELD

The present disclosure relates to the field of semiconductor technologies, and in particular to a display panel.

BACKGROUND

With the rapid development of display technology, the user's requirement for the screen ratio is becoming higher and higher. Due to the need to install components such as a camera, a face recognition device, a fingerprint recognition device on the top of the screen, there are usually slots on the top of the screen in the related art for installing these components. For example, the notch of the Apple phone (for example, iPhone X) affects the overall consistency of the screen, and a full screen display panel is receiving more and more attention in the industry.

SUMMARY

The object of the present invention is to provide a display panel to address deficiencies in the related art.

The present disclosure provides a display panel, including a display region, where the display region includes at least a first region and a second region, and the first region and the second region include first Gallium Nitride-based (GaN-based) light emitting diode (LED) units arranged in an array; where the first region and the second region include a display state and an infrared recognition state; in the display state, the first GaN-based LED units in the first region and the second region are configured to display a visible light screen; in the infrared recognition state, the first GaN-based LED units in the first region are configured for emitting infrared light, and the first GaN-based LED units in the second region are configured for sensing infrared light.

In an embodiment, the first region further includes a visible light imaging state, and in the visible light imaging state, the first GaN-based LED units in the first region are configured to sense visible light.

In an embodiment, each of the first GaN-based LED units includes a plurality of first GaN-based LED structures, each of the plurality of first GaN-based LED structures includes a first red light sensing and emitting layer, a first green light sensing and emitting layer, a first blue light sensing and emitting layer, and an infrared light sensing and emitting layer stacked; materials of the first red light sensing and emitting layer, the first green light sensing and emitting layer, the first blue light sensing and emitting layer, and the infrared light sensing and emitting layer each includes a GaN-based material containing Indium (In), with different components of In from each other; when sensing light, light-sensing charges are generated or not generated according to different wavelengths of received light; when emitting light, different wavelengths and brightness of light are generated based on a magnitude of applied voltage.

In an embodiment, a percentage of amount of substance of In in the first red light sensing and emitting layer is 0.4 to 0.6;
a percentage of amount of substance of In in the first green light sensing and emitting layer is 0.2 to 0.3;
a percentage of amount of substance of In in the first blue light sensing and emitting layer is 0.01 to 0.1; and
a percentage of amount of substance of In in the infrared light sensing and emitting layer is 0.7 to 0.9.

In an embodiment, the display panel further includes a substrate, where the substrate has a plurality of first charge storage regions, each of the first GaN-based LED units includes a plurality of first GaN-based LED structures, and each of the first GaN-based LED structures in the second region is electrically connected to corresponding one of the plurality of first charge storage regions to store generated light-sensing charges.

In an embodiment, a plurality of first transistors are provided on the substrate, a source region or a drain region of at least one of the plurality of first transistors is a first charge storage region; a first metal interconnection sub-layer is provided between the substrate and the plurality of first GaN-based LED structures in the second region, and first metal interconnection structures of the first metal interconnection sub-layer are configured to be electrically connected to the plurality of first transistors.

In an embodiment, the plurality of first transistors form at least first light-sensing processing circuits, and the first light-sensing processing circuits sense a light-sensing electrical signal generated by the plurality of first GaN-based LED structures in the second region;
when the light-sensing electrical signal sensed by the first light-sensing processing circuits from the plurality of first GaN-based LED structures in the second region is not greater than a fifth threshold, the light-sensing electrical signal is stored as an infrared light incidence signal.

In an embodiment, first conductive plugs are provided in the first metal interconnection sub-layer, a first end of each of the first conductive plugs is connected to corresponding one of the plurality of first GaN-based LED structures in the second region, and a second end of each of the first conductive plugs is electrically connected to corresponding one of the plurality of first charge storage regions.

In an embodiment, the plurality of first transistors at least further form first display driving circuits, input ends of the first display driving circuits are configured to receive a red display driving signal, a green display driving signal, and a blue display driving signal, output ends of the first display driving circuits are connected to the first metal interconnection structures, and the red display driving signal, the green display driving signal, and the blue display driving signal are transmitted via the first metal interconnection structures to the plurality of first GaN-based LED structures in the second region.

In an embodiment, the first display driving circuits or the first light-sensing processing circuits are connected to the first metal interconnection structures at a moment.

In an embodiment, a plurality of second transistors are provided on a substrate, a second metal interconnection sub-layer is provided between the substrate and the first GaN-based LED units in the first region, and second metal interconnection structures of the second metal interconnection sub-layer are configured to be electrically connected to the plurality of second transistors.

In an embodiment, each of the first GaN-based LED units includes a plurality of first GaN-based LED structures, the plurality of second transistors form at least infrared light emitting circuits, input ends of the infrared light emitting circuits are configured to receive an infrared emitting signal, output ends of the infrared light emitting circuits are connected to the second metal interconnection structures, and the infrared emitting signal is transmitted via the second metal interconnection structures to the plurality of first GaN-based LED structures in the first region.

In an embodiment, the plurality of second transistors at least further form second display driving circuits, input ends of the second display driving circuits are configured to receive a red display driving signal, a green display driving signal, and a blue display driving signal, output ends of the second display driving circuits are connected to the second metal interconnection structures, and the red display driving signal, the green display driving signal, and the blue display driving signal are transmitted via the second metal interconnection structures to the plurality of first GaN-based LED structures in the second region.

In an embodiment, the second display driving circuits or the infrared light emitting circuits are connected to the second metal interconnection structures at a moment.

In an embodiment, the display panel further includes a substrate, where the substrate has a plurality of second charge storage regions, each of the first GaN-based LED units includes a plurality of first GaN-based LED structures, and each of the first GaN-based LED structures in the first region is electrically connected to corresponding one of the plurality of second charge storage regions to store generated light-sensing charges.

In an embodiment, the plurality of second transistors form at least second light-sensing processing circuits, and the second light-sensing processing circuits sense a light-sensing electrical signal generated by the plurality of first GaN-based LED structures in the first region; where
when the light-sensing electrical signal sensed by the second light-sensing processing circuits from the plurality of first GaN-based LED structures in the first region is greater than a sixth threshold, the light-sensing electrical signal is stored as a blue light incidence signal;
when the light-sensing electrical signal sensed by the second light-sensing processing circuits from the plurality of first GaN-based LED structures in the first region is greater than a seventh threshold and not greater than a sixth threshold, the light-sensing electrical signal is stored as a green light incidence signal;
when the light-sensing electrical signal sensed by the second light-sensing processing circuits from the plurality of first GaN-based LED structures in the first region is greater than an eighth threshold and not greater than a seventh threshold, the light-sensing electrical signal is stored as a red light incidence signal.

In an embodiment, second conductive plugs are provided in the second metal interconnection sub-layer, a first end of each of the second conductive plugs is connected to corresponding one of the plurality of first GaN-based LED structures in the first region, and a second end of each of the second conductive plugs is electrically connected to corresponding one of the plurality of second charge storage regions.

In an embodiment, the display region further includes a third region, the third region includes second GaN-based LED units arranged in an array, and the third region includes a display state and a visible light recognition state, where in the display state, the second GaN-based LED units are configured to display a visible light screen, and in the visible light recognition state, some of the second GaN-based LED units are configured for illumination and the remainder of the second GaN-based LED units are configured for sensing visible light.

In an embodiment, each of the second GaN-based LED units includes a plurality of second GaN-based LED structures, each of the plurality of second GaN-based LED structures includes a second red light sensing and emitting layer, a second green light sensing and emitting layer, and a second blue light sensing and emitting layer stacked; materials of the second red light sensing and emitting layer, the second green light sensing and emitting layer, and the second blue light sensing and emitting layer each includes a GaN-based material containing In, with different components of In from each other; when sensing light, light-sensing charges are generated or not generated according to different wavelengths of received light; when emitting light, different wavelengths and brightness of light are generated based on a magnitude of applied voltage.

In an embodiment, a percentage of amount of substance of In in the second red light sensing and emitting layer is 0.4 to 0.6;
   a percentage of amount of substance of In in the second green light sensing and emitting layer is 0.2 to 0.3; and
   a percentage of amount of substance of In in the second blue light sensing and emitting layer is 0.01 to 0.1.

Figure 1:
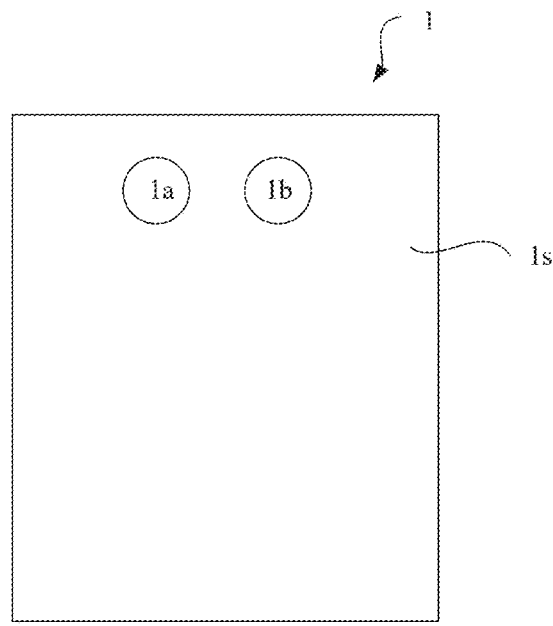
FIG. 1 is a top view illustrating a display panel according to a first embodiment of the present disclosure.

To facilitate understanding of the present disclosure, all reference numerals appearing in the present disclosure are listed below.

| | |
|---|---|
| Display panel 1, and 2 | Display region 1s |
| First region 1a | Second region 1b |
| First GaN-based LED unit 11 | First GaN-based LED structure |
| First red light sensing and emitting layer 111a | First green light sensing and emitting layer 111b |
| First blue light sensing and emitting layer 111c | Infrared light sensing and emitting layer 111d |
| Substrate 10 | First shading structure 112 |
| First charge storage region 101a | First transistor 102 |
| First metal interconnection sub-layer 14a | First metal interconnection structure 141 |
| First conductive plug 142 | First light-sensing processing circuit 131 |
| First display driving circuit 151 | Second transistor 103 |
| Second metal interconnection sub-layer 14b | Second metal interconnection structure 143 |
| Infrared light emitting circuit 16 | Second display driving circuit 152 |
| Lens structure 12 | Second charge storage region 101b |
| Second light-sensing processing circuit 132 | Second conductive plug 144 |

-continued

| | |
|---|---|
| Third region 1c | Second GaN-based LED unit 17 |
| Second red light sensing and emitting layer 171a | Second green light sensing and emitting layer 171b |
| Second blue light sensing and emitting layer 171c | Second shading structure 122 |
| Third charge storage region 101c | Third transistor 104 |
| Third metal interconnection sub-layer 14c | Third metal interconnection structure 145 |
| Third light-sensing processing circuit 133 | Third conductive plug 146 |
| Third display driving circuit | |

DETAILED DESCRIPTION OF THE EMBODIMENTS

To make the forgoing objectives, features and advantages of the present disclosure clearer and more comprehensible, the following describes the specific embodiments of the present disclosure in detail with reference to the accompanying drawings.

Figure 2:
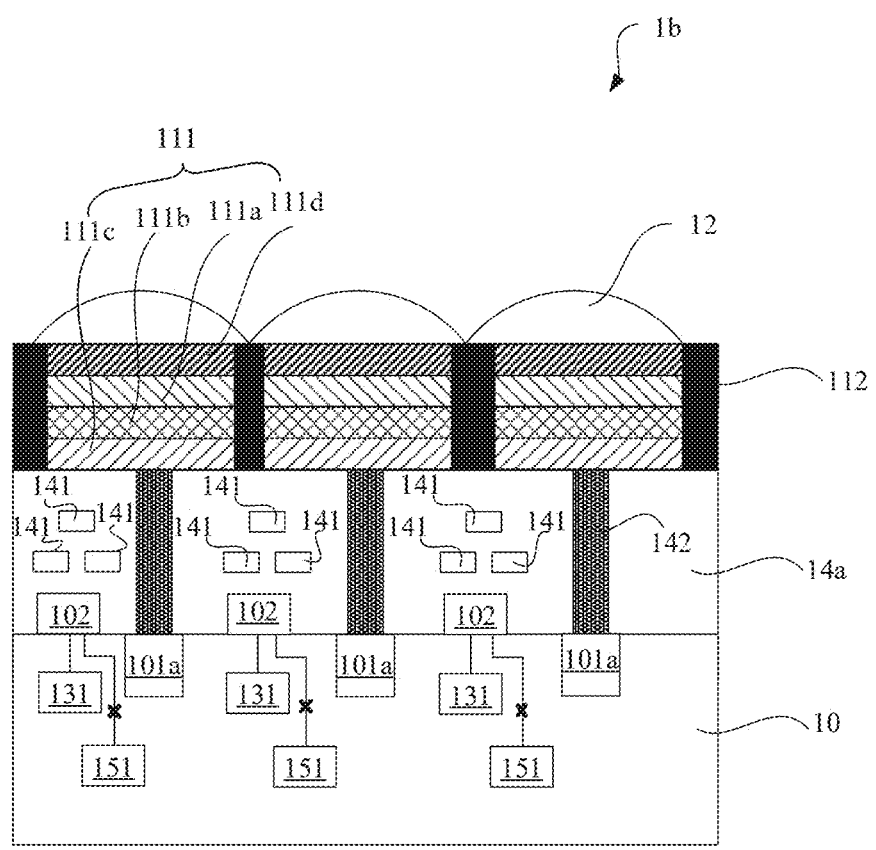
FIG. 2 is a schematic structural diagram illustrating a section of a second region in FIG. 1.
Figure 3:
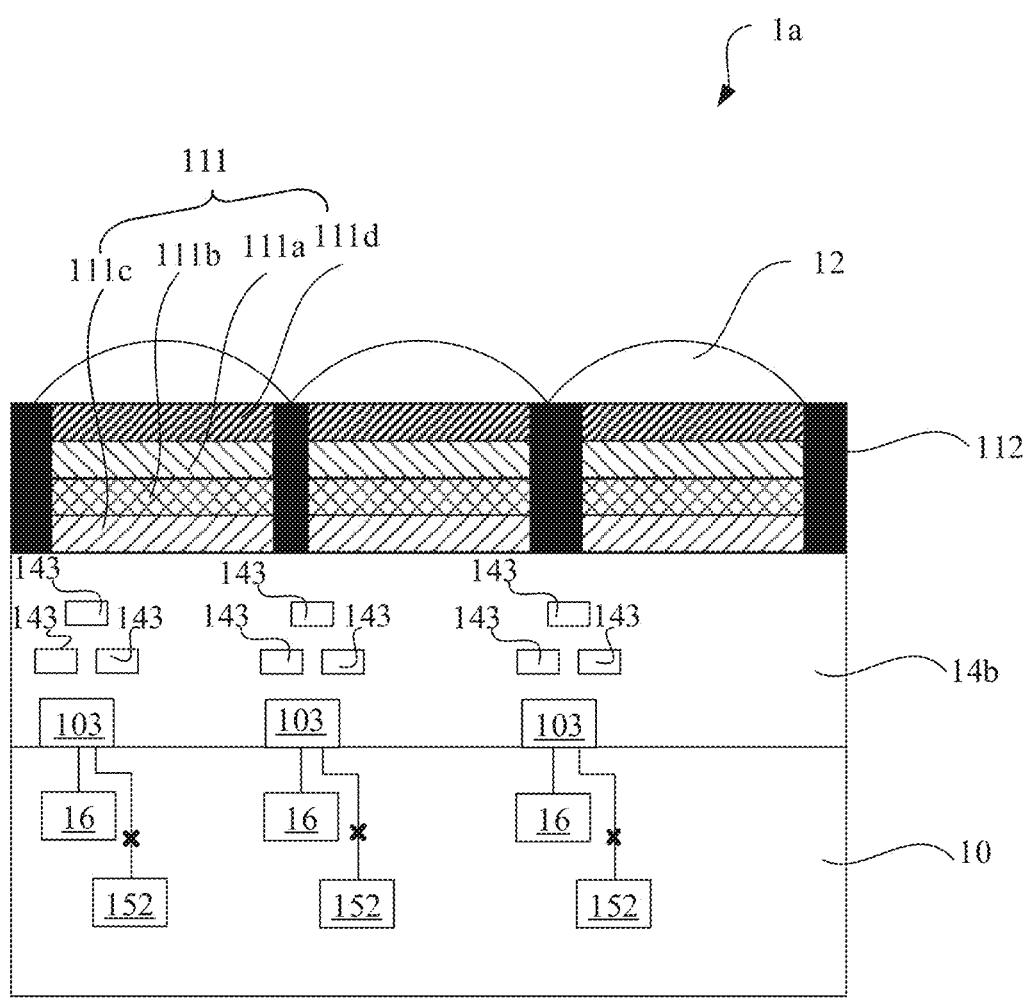
FIG. 3 is a schematic structural diagram illustrating a section of a first region in FIG. 1.

FIG. 1 is a top view illustrating a display panel according to a first embodiment of the present disclosure. FIG. 2 is a schematic structural diagram illustrating a section of a second region in FIG. 1. FIG. 3 is a schematic structural diagram illustrating a section of a first region in FIG. 1.

Referring to FIGS. 1 to 3, the display panel includes a display region Is, where the display region is includes at least a first region 1a and a second region 1b. The first region 1a and the second region 1b include first GaN-based light emitting diode LED units 11 arranged in an array. The first region 1a and the second region 1b include a display state and an infrared recognition state. In the display state, the first GaN-based LED units 11 in the first region Ta and the second region 1b are configured to display a visible light screen. In the infrared recognition state, the first GaN-based LED units 11 in the first region 1a are configured for emitting infrared light, and the first GaN-based LED units 11 in the second region 1b are configured for sensing infrared light.

The infrared recognition is, for example, but is not limited to, a three-dimensional scene recognition containing depth information such as a face.

Referring to FIGS. 2 and 3, each of the first GaN-based LED units 11 includes a plurality of first GaN-based LED structures 111. Each of the plurality of first GaN-based LED structures 111 includes a first red light sensing and emitting layer 111a, a first green light sensing and emitting layer 111b, a first blue light sensing and emitting layer 111c, and an infrared light sensing and emitting layer 111d stacked. Materials of the first red light sensing and emitting layer 111a, the first green light sensing and emitting layer 111b, the first blue light sensing and emitting layer 111c, and the infrared light sensing and emitting layer 111d each includes a GaN-based material containing In, with different components of In from each other. When sensing light, light-sensing charges are generated or not generated according to different wavelengths of received light. When emitting light, different wavelengths and brightness of light are generated based on a magnitude of applied voltage.

The first GaN-based LED structures 111 may be provided on the substrate 10. The substrate 10 may be a monocrystalline silicon substrate.

In this embodiment, in a direction away from the substrate 10, each of the first GaN-based LED structures 111 sequentially includes: the first blue light sensing and emitting layer 111c, the first green light sensing and emitting layer 111b, the first red light sensing and emitting layer 111a, and the infrared light sensing and emitting layer 111d. One of the advantages of the above arrangement is that, infrared light and red light in the sensing light state can prevent excessive attenuation when passing through various light sensing layers and light emitting layers.

A first shading structure 112 may be provided between adjacent first GaN-based LED structures 111. A plurality of first shading structures 112 may be formed above the substrate 10 before the first blue light sensing and emitting layer 111c, the first green light sensing and emitting layer 111b, the first red light sensing and emitting layer 111a, and the infrared light sensing and emitting layer 111d are epitaxially grown on the substrate 10. The material of the first shading structures 112 may include molybdenum metal, an alloy of molybdenum metal, aluminum metal, or an alloy of aluminum metal. In order to prevent crosstalk between light sensing and emitting layers, the sidewall of the first shading structure 112 may be provided with an insulating sidewall (spacer). The insulating sidewall is made of, for example, silicon nitride or silicon dioxide.

The component of In of the infrared light sensing and emitting layer 111d may be greater than the component of In of the first red light sensing and emitting layer 111a, the component of In of the first red light sensing and emitting layer 111a may be greater than the component of In of the first green light sensing and emitting layer 111b, and the component of In of the first green light sensing and emitting layer 111b may be greater than the component of In of the first blue light sensing and emitting layer 111c.

The percentage of the amount of the substance of In of the first red light sensing and emitting layer 111a may be 0.4 to 0.6, a wavelength of the light required for generating the light-sensing current may be 400 nm to 720 nm, and a light-emitting wavelength may also be 400 nm to 720 nm.

The percentage of the amount of the substance of In of the first green light sensing and emitting layer 111b may be 0.2 to 0.3, a wavelength of the light required for generating the light-sensing current may be 400 nm to 600 nm, and a light-emitting wavelength may also be 400 nm to 600 nm.

The percentage of the amount of the substance of In of the first blue light sensing and emitting layer 111c may be 0.01 to 0.1, a wavelength of the light required for generating the light-sensing current may be 400 nm to 500 nm, and a light-emitting wavelength may also be 400 nm to 500 nm.

The percentage of the amount of the substance of In of the infrared light sensing and emitting layer 111d may be 0.7 to 0.9, a wavelength of the light required for generating the light-sensing current may be 800 nm to 950 nm, and a light-emitting wavelength may also be 800 nm to 950 nm.

It is to be noted that the component of In of the first red light sensing and emitting layer 111a means: a percentage of the amount of the substance of In to a sum of the amounts of the substances of all positively charged elements in the first red light sensing and emitting layer 111a. For example, the material of the first red light sensing and emitting layer 111a is indium gallium nitride (InGaN), and the component of In means: the percentage of the amount of the substance of In to the sum of the amount of the substance of In and the amount of the substance of Ga. For example, the material of the first red light sensing and emitting layer 111a is indium aluminum gallium nitride (InAlGaN), and the component of In means: the percentage of the amount of the substance of In to the sum of the amount of the substance of In, the amount of the substance of Al, and the amount of the substance of Ga.

The component of In of the first green light sensing and emitting layer 111b means: a percentage of the amount of the substance of In to a sum of the amounts of the substances of all positively charged elements in the first green light sensing and emitting layer 111b.

The component of In of the first blue light sensing and emitting layer 111c means: a percentage of the amount of the substance of In to a sum of the amounts of the substances of all positively charged elements in the first blue light sensing and emitting layer 111c.

The component of In of the infrared light sensing and emitting layer 111d means: a percentage of the amount of the substance of In to a sum of the amounts of the substances of all positively charged elements in the infrared light sensing and emitting layer 111d.

Furthermore, in this embodiment, ranges of values each includes endpoint values.

In this way, for each of the first GaN-based LED structures 111 in the first region 1a and the second region 1b, and if the driving voltage is not greater than a first threshold, the infrared light sensing and emitting layer 111d emits infrared light.

If the driving voltage is greater than the first threshold and not greater than a second threshold, the first red light sensing and emitting layer 111a emits red light.

If the driving voltage is greater than the second threshold and not greater than a third threshold, the first green light sensing and emitting layer 111b emits green light.

If the driving voltage is greater than the third threshold and not greater than a fourth threshold, the first blue light sensing and emitting layer 111c emits blue light.

The first threshold is less than the second threshold, the second threshold is less than the third threshold, and the third threshold is less than the fourth threshold.

If the infrared light is irradiated, only the infrared light sensing and emitting layer 111d can generate a light-sensing electrical signal.

Thus, even if each of the first GaN-based LED structures 111 has the same structure, it is still possible to adjust the light-emitting color by the driving voltage, as well as to determine whether or not infrared light is irradiated by the light-sensing electrical signal.

In this embodiment, referring to FIG. 2, the substrate 10 has a plurality of first charge storage regions 101a. The first charge storage region 101a may be a floating diffusion (FD) region, for example, an n-type lightly doped region formed in a p-type well may be used as a floating diffusion region.

Each of the first GaN-based LED structures 111 in the second region 1b is electrically connected to a first charge storage region 101a for storing the generated light-sensing charges.

In this embodiment, the substrate 10 has a plurality of first transistors 102, with a source or drain region of at least one of the first transistors 102 being the first charge storage region 101a. A first metal interconnection sub-layer 14a is provided between the substrate 10 and the first GaN-based LED structures 111 in the second region 1b, and first sub-metal interconnection structures 141 of the first metal interconnection sub-layer 14a are configured to be electrically connected to the plurality of first transistors 102.

Some of the first transistors 102 form a first light-sensing processing circuits 131, and the first light-sensing processing circuits 131 sense a light-sensing electrical signal generated by the first GaN-based LED structures 111. When the sensed light-sensing electrical signal is not greater than a fifth threshold, the sensed light-sensing electrical signal is stored as an infrared light incidence signal.

In addition, the other first transistors 102 may include: a first transfer transistor, a first reset transistor, a first source-following transistor, and a first row-selecting transistor. The source electrode of the first transfer transistor is electrically connected to the first GaN-based LED structure 111 via the first metal interconnect structure 141, and the drain electrode is a floating diffusion region, and thus the first transfer transistor is used to transfer photoelectric charges from the first GaN-based LED structures 111 to the floating diffusion region. The source electrode of the first reset transistor is a floating diffusion region, and the drain electrode is electrically connected to the power supply voltage line through the first metal interconnection structure 141. Therefore, the first reset transistor is used to reset the floating diffusion region to voltage drain drain (VDD). The gate electrode of the first source-following transistor is electrically connected to the floating diffusion region through the first metal interconnection structures 141, the source electrode is electrically connected to the VDD, and the drain electrode is electrically connected to the source electrode of the first row-selecting transistor. The gate electrode of the first row-selecting transistor is electrically connected to the row scan line through the first metal interconnection structure 141, to output the drain voltage of the first source-following transistor in response to an address signal. The source electrode and the drain electrode mentioned above can be exchanged according to the current flow direction.

The drain electrode of the first row-selecting transistor may be connected to an input end of the first light-sensing processing circuit 131.

In addition, referring to FIG. 2, the first metal interconnect sub-layer 14a has first conductive plugs 142. A first end of each of the first conductive plugs 142 is connected to corresponding one of the first GaN-based LED structures 111 in the second region 1b, and a second end of each of the first conductive plugs 142 is electrically connected to corresponding one of the first charge storage regions 101a. The first end of the first conductive plug 142 is connected to a bottom wall of a first GaN-based LED structure 111.

In other embodiments, the first end of the first conductive plug 142 may be connected to a sidewall of the first GaN-based LED structure 111. It has been shown the light-sensing layer the GaN-based material containing In flows more current in the plane direction than in the thickness direction, and thus, the first conductive plug 142 is connected to the sidewall of the respective first GaN-based LED structure 111, such that the amount of transferred photoelectric charges is increased.

In an embodiment, the sidewall of the first GaN-based LED structure 111 to which the first end of the first conductive plug 142 is connected is close to the first shading structure 112.

The plurality of first transistors 102 at least further form first display driving circuits 151, input ends of the first display driving circuits 151 are configured to receive a red display driving signal, a green display driving signal, and a blue display driving signal. Output ends of the first display driving circuits 151 are connected to the first metal interconnection structures 141, and the red display driving signal, the green display driving signal, and the blue display driving signal are transmitted via the first metal interconnection structures 141 to the plurality of first GaN-based LED structures 111 in the second region Tb.

The first display driving circuits 151 or the first light-sensing processing circuits 131 are connected to the first metal interconnection structure 141 at a moment, such that the second region Tb is in the display state or the infrared recognition state.

Referring to FIG. 3, a plurality of second transistors 103 are provided on a substrate 10. A second metal interconnection sub-layer 14b is provided between the substrate 10 and the first GaN-based LED units 11 in the first region 1a, and second metal interconnection structures 143 of the second metal interconnection sub-layer 14b are configured to be electrically connected to the plurality of second transistors 103.

The plurality of second transistors 103 form at least infrared light emitting circuits 16. Input ends of the infrared light emitting circuits 16 are configured to receive an infrared emitting signal, output ends of the infrared light emitting circuits 16 are connected to the second metal interconnection structures 143, and the infrared emitting signal is transmitted via the second metal interconnection structures 143 to the plurality of first GaN-based LED structures 111 in the first region T a. The infrared emitting circuits 16 are configured for realizing that the first GaN-based LED structures 111 in the first region T a emit the infrared light in the infrared recognition state.

The plurality of second transistors 102 at least further form second display driving circuits 152. Input ends of the second display driving circuits 152 are configured to receive a red display driving signal, a green display driving signal, and a blue display driving signal, output ends of the second display driving circuits 152 are connected to the second metal interconnection structures 143, and the red display driving signal, the green display driving signal, and the blue display driving signal are transmitted via the second metal interconnection structures 143 to the plurality of first GaN-based LED structures 111 in the second region Tb. The second display driving circuits 152 are configured for realizing that the first GaN-based LED structures 111 in the first region T a emit visible light in the display state.

The second display driving circuits 152 or the infrared light emitting circuits 16 are connected to the second metal interconnection structures 143 at a moment, such that the first region 1a is in the display state or the infrared recognition state.

In the display panel 1, in addition to the first region 1a and the second region 1b, other regions may also be provided with the first GaN-based LED units 11 arranged in an array, each of the first GaN-based LED units 11 includes a plurality of first GaN-based LED structures 111.

In the display state, all the first GaN-based LED structures 111 in all the regions of the display panel 1 may collectively display a visible light screen.

A side of the first GaN-based LED unit 11 away from the substrate 10 is provided with a lens structure 12. the lens structure 12 includes a plurality of lenses, and a lens is provided above each of the first GaN-based LED structures 111.

In this embodiment, the first GaN-based LED unit 11 is disposed above the substrate 10 instead of being spread flat on the surface of the substrate 10, and thus a large design space can be provided for the first charge storage area 101a and the storage capacitance, resulting in a larger full-well capacity, which brings about an improvement in a high dynamic range, and the design conditions for a global shutter are naturally possessed.

Figure 4:
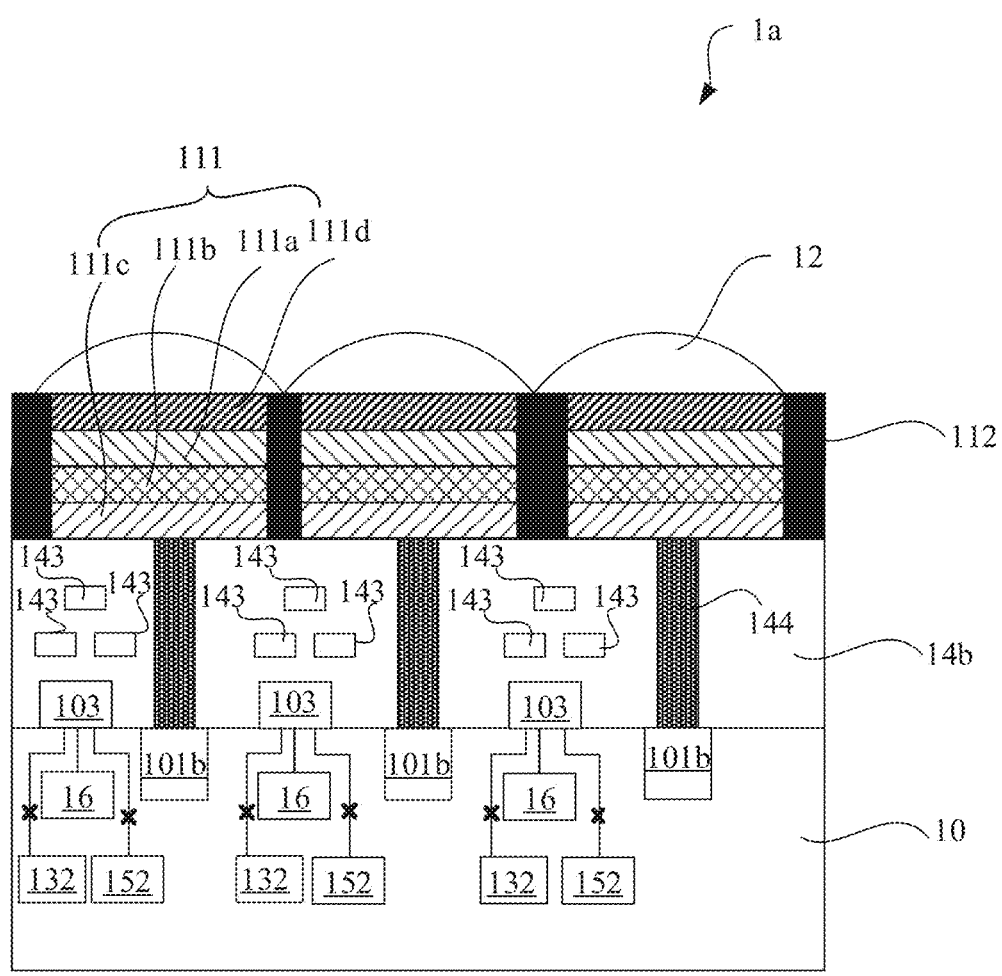
FIG. 4 is a schematic structural diagram illustrating a section of a first region according to a second embodiment of the present disclosure.

FIG. 4 is a schematic structural diagram illustrating a section of a first region according to a second embodiment of the present disclosure.

Referring to FIG. 4 and FIG. 3, the display panel of the second embodiment is substantially the same as the display panel 1 of the first embodiment, with the difference only in that: in the second embodiment, the first region Ta further includes a visible light imaging state, and in the visible light imaging state, the first GaN-based LED units of the first region 1a are configured for sensing visible light.

Thus, for each of the first GaN-based LED structures 111, if the blue light is irradiated, the first red light sensing and emitting layer 111a, the first green light sensing and emitting layer 111b, the first blue light sensing and emitting layer 111c, and the infrared light sensing and emitting layer 111d can generate the light-sensing electrical signal. If the green light is irradiated, the first red light sensing and emitting layer 111a, the first green light sensing and emitting layer 111b, and the infrared light sensing and emitting layer 111d can generate alight-sensing electrical signal. If the red light is irradiated, the first red light sensing and emitting layer 111a and the infrared light sensing and emitting layer 111d can generate a light-sensing electrical signal. If infrared light is irradiated, only the infrared light sensing and emitting layer 111d can generate the light-sensing electrical signal. In other words, for the same first GaN-based LED structure 111, the light-sensing electrical signal generated by the blue light irradiation is greater than the light-sensing electrical signal generated by the green light irradiation, the light-sensing electrical signal generated by the green light irradiation is greater than the light-sensing electrical signal generated by the red light irradiation, and the light-sensing electrical signal generated by the red light irradiation is greater than the light-sensing electrical signal generated by the infrared light irradiation. Thus, even if each of the first GaN-based LED structures 111 has the same structure, it is still possible to distinguish the color and brightness of the irradiated light by the light-sensing electrical signal.

Specifically, the substrate 10 has a plurality of second charge storage regions 101b. Each of the first GaN-based LED structures 111 in the first region 1a is electrically connected to corresponding one of the second charge storage regions 101b for storing the generated light-sensing charges.

The plurality of second transistors 103 form at least second light-sensing processing circuits 132, and the second light-sensing processing circuits 132 sense a light-sensing electrical signal generated by the plurality of first GaN-based LED structures 111 in the first region ha.

When the light-sensing electrical signal sensed by the second light-sensing processing circuits 132 from the plurality of first GaN-based LED structures 111 in the first region 1a is greater than a sixth threshold, the light-sensing electrical signal is stored as a blue light incidence signal.

When the light-sensing electrical signal sensed by the second light-sensing processing circuits 132 from the plurality of first GaN-based LED structures 111 in the first region 1a is greater than a seventh threshold and not greater than a sixth threshold, the light-sensing electrical signal is stored as a green light incidence signal.

When the light-sensing electrical signal sensed by the second light-sensing processing circuits 132 from the plurality of first GaN-based LED structures 111 in the first region Ta is greater than an eighth threshold and not greater than a seventh threshold, the light-sensing electrical signal is stored as a red light incidence signal.

The sixth threshold is greater than the seventh threshold, and the seventh threshold is greater than the eighth threshold.

The second light-sensing processing circuits 132, the second display driving circuits 152, or the infrared light emitting circuits 16 are connected to the second metal interconnection structures 143 at a moment, such that the first region Ta is in the visible light imaging state, the display state, or the infrared recognition state. The visible light imaging state is, for example, but is not limited to, an image collected by a camera.

Second conductive plugs 144 are provided in the second metal interconnection sub-layer 14b, a first end of each of the second conductive plugs 144 is connected to corresponding one of the plurality of first GaN-based LED structures 111 in the first region Ta, and a second end of each of the second conductive plugs 144 is electrically connected to corresponding one of the plurality of second charge storage regions 101b. The first end of the second conductive plug 144 is connected to a bottom wall of a first GaN-based LED structure 111.

In other embodiments, the first end of the second conductive plug 144 may be connected to a sidewall of the first GaN-based LED structure 111. It has been shown the light-sensing layer the GaN-based material containing In flows more current in the plane direction than in the thickness direction, and thus, the second conductive plug 144 is connected to the sidewall of the respective first GaN-based LED structure 111, such that the amount of transferred photoelectric charges is increased.

In an embodiment, the sidewall of the first GaN-based LED structure 111 to which the first end of the second conductive plug 144 is connected is close to the first shading structure 112.

Figure 5:
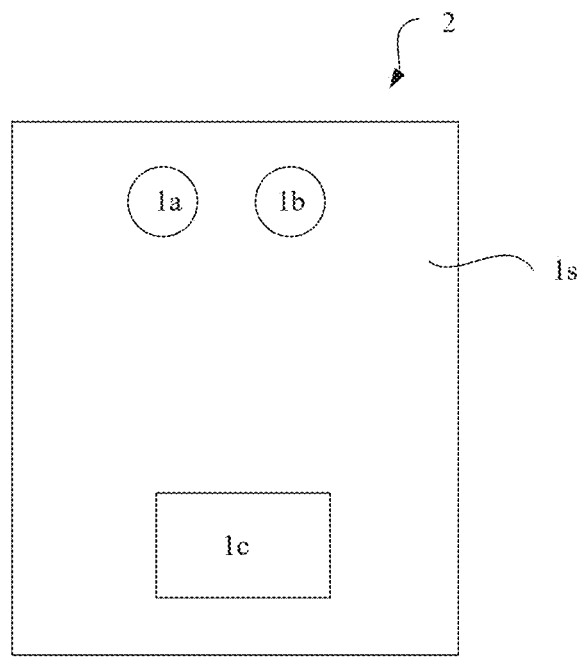
FIG. 5 is a top view illustrating a display panel according to a third embodiment of the present disclosure.
Figure 6:
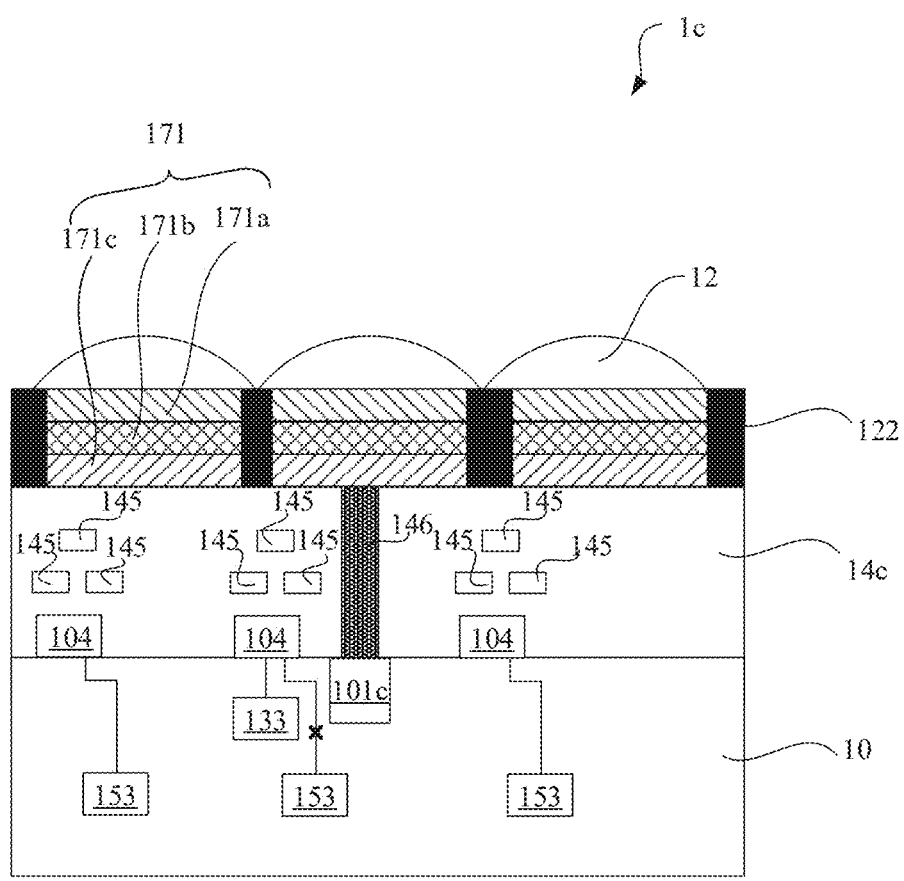
FIG. 6 is a schematic structural diagram illustrating a section of a third region in FIG. 5.

FIG. 5 is a top view illustrating a display panel according to a third embodiment of the present disclosure. FIG. 6 is a schematic structural diagram illustrating a section of a third region in FIG. 5.

Referring to FIG. 5, FIG. 6, and FIGS. 1 to 3, the display panel 2 of the present third embodiment is substantially the same as the display panel 1 of the first and second embodiments, with the difference only in that: the display region 1s also includes a third region 1c, the third region 1c includes second GaN-based LED units 17 arranged in an array. The third region 1c includes a display state and a visible light recognition state, and in the display state. In the display state, the second GaN-based LED units 17 are configured to display a visible light screen, and in the visible light recognition state, some of the second GaN-based LED units 17 are configured for illumination and the remainder of the second GaN-based LED units 17 are configured for sensing visible light.

Sensing the visible light is, for example, but is not limited to, fingerprint recognition.

In an embodiment, the second GaN-based LED units 17 for illumination and the second GaN-based LED units 17 for sensing the visible light are distributed alternately.

Referring to FIG. 5, each of the second GaN-based LED units 17 includes a plurality of second GaN-based LED structures 171, and each of the plurality of second GaN-based LED structures 171 includes a second red light sensing and emitting layer 171a, a second green light sensing and emitting layer 171b, and a second blue light sensing and emitting layer 171c stacked. Materials of the second red light sensing and emitting layer 171a, the second green light sensing and emitting layer 171b, and the second blue light sensing and emitting layer 171c each includes a GaN-based material containing In, with different components of In from each other.

The second GaN-based LED structures 171 may also be provided on the substrate 10.

In this embodiment, in a direction away from the substrate 10, each of the second GaN-based LED structures 171 sequentially includes: the second blue light sensing and emitting layer 171c, the second green light sensing and emitting layer 171b, and the second red light sensing and emitting layer 171a. One of the advantages of the above arrangement is that, the red light in the sensing light state can prevent excessive attenuation when passing through various light sensing layers and light emitting layers.

A second shading structure 122 may be provided between adjacent second GaN-based LED structures 171. The material of the second shading structures 122 may include molybdenum metal, an alloy of molybdenum metal, aluminum metal, or an alloy of aluminum metal. In addition, an insulating sidewall (spacer) may be provided between the second shading structure 122 and the second GaN-based LED structure 171.

The component of In of the second red light sensing and emitting layer 171a may be greater than the component of In of the second green light sensing and emitting layer 171b, and the component of In of the second green light sensing and emitting layer 171b may be greater than the component of In of the second blue light sensing and emitting layer 111c.

The percentage of the amount of the substance of In of the second red light sensing and emitting layer 171a may be 0.4 to 0.6, a wavelength of the light required for generating the light-sensing current may be 400 nm to 720 nm, and a light-emitting wavelength may also be 400 nm to 720 nm.

The percentage of the amount of the substance of In of the second green light sensing and emitting layer 171b may be 0.2 to 0.3, a wavelength of the light required for generating the light-sensing current may be 400 nm to 600 nm, and a light-emitting wavelength may also be 400 nm to 600 nm.

The percentage of the amount of the substance of In of the second blue light sensing and emitting layer 171c may be 0.01 to 0.1, a wavelength of the light required for generating the light-sensing current may be 400 nm to 500 nm, and a light-emitting wavelength may also be 400 nm to 500 nm.

In this embodiment, referring to FIG. 6, the substrate 10 has a plurality of third charge storage regions 101c. The third charge storage region 101c may be a floating diffusion (FD) region, for example, an n-type lightly doped region formed in a p-type well may be used as a floating diffusion region.

Each of the second GaN-based LED structures 171 for sensing visible light is electrically connected to a third charge storage region 101c for storing the generated light-sensing charges.

The substrate 10 has a plurality of third transistors 104. A third metal interconnection sub-layer 14c is provided between the substrate 10 and the second GaN-based LED structures 171 in the third region 1c, and third sub-metal interconnection structures 145 of the third metal interconnection sub-layer 14c are configured to be electrically connected to the plurality of third transistors 104.

Some of the third transistors 104 form a third light-sensing processing circuits 133, and the third light-sensing processing circuits 133 sense a light-sensing electrical signal generated by the second GaN-based LED structures 171.

When the light-sensing electrical signal sensed by the third light-sensing processing circuits 133 from the second GaN-based LED structures 171 is greater than a ninth threshold, the light-sensing electrical signal is stored as a blue light incidence signal.

When the light-sensing electrical signal sensed by the third light-sensing processing circuits 133 from the second GaN-based LED structures 171 is greater than a tenth threshold and not greater than a ninth threshold, the light-sensing electrical signal is stored as a green light incidence signal.

When the light-sensing electrical signal sensed by the third light-sensing processing circuits 133 from the second GaN-based LED structures 171 is greater than an eleventh threshold and not greater than a tenth threshold, the light-sensing electrical signal is stored as a red light incidence signal.

The ninth threshold is greater than the tenth threshold, and the tenth threshold is greater than the eleventh threshold.

In other words, for the same second GaN-based LED structure 171, the light-sensing electrical signal generated by the blue light irradiation is greater than the light-sensing electrical signal generated by the green light irradiation, and the light-sensing electrical signal generated by the green light irradiation is greater than the light-sensing electrical signal generated by the red light irradiation. Thus, even if each of the second GaN-based LED structures 171 has the same structure, it is still possible to distinguish the color and brightness of the irradiated light by the light-sensing electrical signal.

In addition, the other third transistors 104 may include: a second transfer transistor, a second reset transistor, a second source-following transistor, and a second row-selecting transistor. The source electrode of the second transfer transistor is electrically connected to the second GaN-based LED structure 171 via the third metal interconnect structure 145, and the drain electrode is a floating diffusion region, and thus the second transfer transistor is used to transfer photoelectric charges from the second GaN-based LED structures 171 to the floating diffusion region. The source electrode of the second reset transistor is a floating diffusion region, and the drain electrode is electrically connected to the power supply voltage line through the third metal interconnection structure 145. Therefore, the second reset transistor is used to reset the floating diffusion region to voltage drain drain (VDD). The gate electrode of the second source-following transistor is electrically connected to the floating diffusion region through the third metal interconnection structures 145, the source electrode is electrically connected to the VDD, and the drain electrode is electrically connected to the source electrode of the second row-selecting transistor. The gate electrode of the second row-selecting transistor is electrically connected to the row scan line through the second metal interconnection structure 143, to output the drain voltage of the first source-following transistor in response to an address signal. The source electrode and the drain electrode mentioned above can be exchanged according to the current flow direction.

It is to be noted that the "second" in the second row-selecting transistor is used to distinguish the first row-selecting transistor, and does not refer to a transistor connected to the second row of the GaN-based LED structures.

The drain electrode of the second row-selecting transistor may be connected to an input end of the third light-sensing processing circuit 133.

In addition, referring to FIG. 6, the third metal interconnect sub-layer 14c has a third conductive plug 146. A first end of the third conductive plug 146 is connected to the second GaN-based LED structures 171 for sensing visible light in the third region 1c, and a second end of the third conductive plug 146 is electrically connected to the third charge storage regions 101c. The first end of the third conductive plug 146 is connected to a bottom wall of a second GaN-based LED structure 171.

In other embodiments, the first end of the third conductive plug 146 may be connected to a sidewall of the second GaN-based LED structure 171. It has been shown the light-sensing layer the GaN-based material containing In flows more current in the plane direction than in the thickness direction, and thus, the third conductive plug 146 is connected to the sidewall of the respective second GaN-based LED structure 171, such that the amount of transferred photoelectric charges is increased.

The plurality of third transistors 103 at least further form third display driving circuits 153, input ends of the third display driving circuits 153 are configured to receive a red display driving signal, a green display driving signal, and a blue display driving signal. Output ends of the third display driving circuits 153 are connected to the first metal interconnection structures 141, and the red display driving signal, the green display driving signal, and the blue display driving signal are transmitted via the third metal interconnection structures 145 to the plurality of second GaN-based LED structures 171 in the third region 1c. The third display driving circuits 153 are configured for realizing that the second GaN-based LED structures 171 in the third region 1c emit visible light in the display state. When emitting visible light in the display state, the red display driving signal, the green display driving signal, and the blue display driving signal correspond to the same luminous brightness. When mixed to form white light, they serve as illumination.

The third display driving circuits 153 or the third light-sensing processing circuits 133 are connected to the third metal interconnection structure 145 at a moment, such that the third region 1c is in the display state or the infrared recognition state.

The visible light recognition is, for example but not limited to, fingerprint recognition.

A side of the second GaN-based LED unit 17 away from the substrate 10 is provided with a lens structure 12. the lens structure 12 includes a plurality of lenses, and a lens is provided above each of the second GaN-based LED structures 171.

In the display panel 2, in addition to the first region 1a, the second region 1b and the third region 1c, other regions may also be provided with the second GaN-based LED units 17 arranged in an array, each of the second GaN-based LED units 17 includes a plurality of second GaN-based LED structures 171. In the display state, all the second GaN-based LED structures 171 in all the regions of the display panel 1 may collectively display a visible light screen.

Compared with the related art, the present disclosure has the following beneficial effects.

1) The LED units in the first region and the second region are manufactured by using the GaN-based material, and the GaN-based LED unit, as a pixel unit, can not only emit visible light and have a visible light display function, but also emit infrared light and light-sensing infrared light for infrared recognition. Installing the infrared recognition device on the display panel can be avoided, i.e., occupying the display region can be avoided, so as to realize a full screen.

The infrared recognition is, for example, but is not limited to, a three-dimensional scene recognition containing depth information such as a face.

2) In some embodiments, the first region also includes a visible light imaging state, and in the visible light imaging state, the first GaN-based LED units in the first region are used to sense visible light. Installing a camera on the display panel can be avoided, i.e., occupying the display region can be avoided, so as to realize a full screen.

3) In some embodiments, the display region further includes the third region, the third region includes the second GaN-based LED units arranged in an array, the third region includes the display state and the visible light recognition state, in the display state, the second GaN-based LED units are used for displaying the visible light image, and in the visible light recognition state, some of the second GaN-based LED units are used for illumination, and the remainder of the second GaN-based LED units are used for sensing visible light. Installing a visible light recognition device on the display panel can be avoided, i.e., occupying the display region can be avoided, so as to realize a full screen.

The visible light recognition is, for example, but is not limited to, fingerprint recognition.

The foregoing is only some embodiments of the present disclosure and is not intended to limit the present disclosure, and any modifications, equivalent replacements, improvements, etc. made within the spirit and principles of the present disclosure shall be included within the scope of the present disclosure.

The invention claimed is:

1. A display panel with gallium nitride-based light emitting diode units with display state and infrared recognition state, comprising a display region,
wherein the display region comprises at least a first region and a second region, and the first region and the second region comprise first Gallium Nitride-based (GaN-based) light emitting diode (LED) units arranged in an array;
wherein the first region and the second region comprise a display state and an infrared recognition state; in the display state, the first GaN-based LED units in the first region and the second region are configured to display a visible light screen; in the infrared recognition state, the first GaN-based LED units in the first region are configured for emitting infrared light, and the first GaN-based LED units in the second region are configured for sensing infrared light;
wherein the display panel further comprises a substrate, wherein the substrate has a plurality of first charge storage regions, each of the first GaN-based LED units comprises a plurality of first GaN-based LED structures, and each of the first GaN-based LED structures in the second region is electrically connected to corresponding one of the plurality of first charge storage regions to store generated light-sensing charges;
wherein a plurality of first transistors are provided on the substrate, a source region or a drain region of at least one of the plurality of first transistors is the first charge storage region;
wherein a first metal interconnection sub-layer is provided between the substrate and the plurality of first GaN-based LED structures in the second region, and first metal interconnection structures of the first metal interconnection sub-layer are configured to be electrically connected to the plurality of first transistors; and
wherein the plurality of first transistors form at least first light-sensing processing circuits, and the first light-sensing processing circuits sense a light-sensing electrical signal generated by the plurality of first GaN-based LED structures in the second region; when the light-sensing electrical signal sensed by the first light-sensing processing circuits from the plurality of first GaN-based LED structures in the second region is not greater than a fifth threshold, the light-sensing electrical signal is stored as an infrared light incidence signal.

2. The display panel of claim 1, wherein the first region further comprises a visible light imaging state, and in the visible light imaging state, the first GaN-based LED units in the first region are configured to sense visible light.

3. The display panel of claim 1, wherein
each of the first GaN-based LED units comprises a plurality of first GaN-based LED structures, each of the plurality of first GaN-based LED structures comprises a first red light sensing and emitting layer, a first green light sensing and emitting layer, a first blue light sensing and emitting layer, and an infrared light sensing and emitting layer stacked;
materials of the first red light sensing and emitting layer, the first green light sensing and emitting layer, the first blue light sensing and emitting layer, and the infrared light sensing and emitting layer each comprises a GaN-based material containing Indium (In), with different components of In from each other;
when sensing light, light-sensing charges are generated or not generated according to different wavelengths of received light; when emitting light, different wavelengths and brightness of light are generated based on a magnitude of applied voltage.

4. The display panel of claim 3, wherein
a percentage of amount of substance of In in the first red light sensing and emitting layer is 0.4 to 0.6;
a percentage of amount of substance of In in the first green light sensing and emitting layer is 0.2 to 0.3;
a percentage of amount of substance of In in the first blue light sensing and emitting layer is 0.01 to 0.1; and
a percentage of amount of substance of In in the infrared light sensing and emitting layer is 0.7 to 0.9.

5. The display panel of claim 1, wherein first conductive plugs are provided in the first metal interconnection sub-layer, a first end of each of the first conductive plugs is connected to corresponding one of the plurality of first GaN-based LED structures in the second region, and a second end of each of the first conductive plugs is electrically connected to corresponding one of the plurality of first charge storage regions.

6. The display panel of claim 1, wherein the plurality of first transistors at least further form first display driving circuits, input ends of the first display driving circuits are configured to receive a red display driving signal, a green display driving signal, and a blue display driving signal, output ends of the first display driving circuits are connected to the first metal interconnection structures, and the red display driving signal, the green display driving signal, and the blue display driving signal are transmitted via the first metal interconnection structures to the plurality of first GaN-based LED structures in the second region.

7. The display panel of claim 6, wherein the first display driving circuits or the first light-sensing processing circuits are connected to the first metal interconnection structures at a moment.

8. The display panel of claim 1, wherein a plurality of second transistors are provided on the substrate, a second metal interconnection sub-layer is provided between the substrate and the first GaN-based LED units in the first region, and second metal interconnection structures of the second metal interconnection sub-layer are configured to be electrically connected to the plurality of second transistors.

9. The display panel of claim 8, wherein each of the first GaN-based LED units comprises a plurality of first GaN-based LED structures, the plurality of second transistors form at least infrared light emitting circuits, input ends of the infrared light emitting circuits are configured to receive an infrared emitting signal, output ends of the infrared light emitting circuits are connected to the second metal interconnection structures, and the infrared emitting signal is transmitted via the second metal interconnection structures to the plurality of first GaN-based LED structures in the first region.

10. The display panel of claim 9, wherein the plurality of second transistors at least further form second display driving circuits, input ends of the second display driving circuits are configured to receive a red display driving signal, a green display driving signal, and a blue display driving signal, output ends of the second display driving circuits are connected to the second metal interconnection structures, and the red display driving signal, the green display driving signal, and the blue display driving signal are transmitted via the second metal interconnection structures to the plurality of first GaN-based LED structures in the second region.

11. The display panel of claim 10, wherein the second display driving circuits or the infrared light emitting circuits are connected to the second metal interconnection structures at a moment.

12. The display panel of claim 8, wherein the substrate has a plurality of second charge storage regions, each of the first GaN-based LED units comprises a plurality of first GaN-based LED structures, and each of the first GaN-based LED structures in the first region is electrically connected to corresponding one of the plurality of second charge storage regions to store generated light-sensing charges.

13. The display panel of claim 12, wherein the plurality of second transistors form at least second light-sensing processing circuits, and the second light-sensing processing circuits sense a light-sensing electrical signal generated by the plurality of first GaN-based LED structures in the first region; wherein
when the light-sensing electrical signal sensed by the second light-sensing processing circuits from the plurality of first GaN-based LED structures in the first region is greater than a sixth threshold, the light-sensing electrical signal is stored as a blue light incidence signal;
when the light-sensing electrical signal sensed by the second light-sensing processing circuits from the plurality of first GaN-based LED structures in the first region is greater than a seventh threshold and not greater than the sixth threshold, the light-sensing electrical signal is stored as a green light incidence signal; and
when the light-sensing electrical signal sensed by the second light-sensing processing circuits from the plurality of first GaN-based LED structures in the first region is greater than an eighth threshold and not greater than the seventh threshold, the light-sensing electrical signal is stored as a red light incidence signal.

14. The display panel of claim 12, wherein second conductive plugs are provided in the second metal interconnection sub-layer, a first end of each of the second conductive plugs is connected to corresponding one of the plurality of first GaN-based LED structures in the first region, and a second end of each of the second conductive plugs is electrically connected to corresponding one of the plurality of second charge storage regions.

15. The display panel of claim 1, wherein the display region further comprises a third region, the third region comprises second GaN-based LED units arranged in an array, and the third region comprises a display state and a visible light recognition state,
wherein in the display state, the second GaN-based LED units are configured to display a visible light screen, and in the visible light recognition state, some of the second GaN-based LED units are configured for illumination and the remainder of the second GaN-based LED units are configured for sensing visible light.

16. The display panel of claim 15, wherein
each of the second GaN-based LED units comprises a plurality of second GaN-based LED structures, each of the plurality of second GaN-based LED structures comprises a second red light sensing and emitting layer, a second green light sensing and emitting layer, and a second blue light sensing and emitting layer stacked;
materials of the second red light sensing and emitting layer, the second green light sensing and emitting layer, and the second blue light sensing and emitting layer each comprises a GaN-based material containing In, with different components of In from each other;
when sensing light, light-sensing charges are generated or not generated according to different wavelengths of received light; when emitting light, different wavelengths and brightness of light are generated based on a magnitude of applied voltage.

17. The display panel of claim 16, wherein
a percentage of amount of substance of In in the second red light sensing and emitting layer is 0.4 to 0.6;
a percentage of amount of substance of In in the second green light sensing and emitting layer is 0.2 to 0.3; and
a percentage of amount of substance of In in the second blue light sensing and emitting layer is 0.01 to 0.1.

18. A display panel with gallium nitride-based light emitting diode units with display state and infrared recognition state, comprising a display region,
wherein the display region comprises at least a first region and a second region, and the first region and the second region comprise first Gallium Nitride-based (GaN-based) light emitting diode (LED) units arranged in an array;
wherein the first region and the second region comprise a display state and an infrared recognition state; in the display state, the first GaN-based LED units in the first region and the second region are configured to display a visible light screen; in the infrared recognition state, the first GaN-based LED units in the first region are configured for emitting infrared light, and the first GaN-based LED units in the second region are configured for sensing infrared light;
wherein the display panel further comprises a substrate, wherein a plurality of second transistors are provided on the substrate, a second metal interconnection sub-layer is provided between the substrate and the first GaN-based LED units in the first region, and second metal interconnection structures of the second metal interconnection sub-layer are configured to be electrically connected to the plurality of second transistors; and
wherein each of the first GaN-based LED units comprises a plurality of first GaN-based LED structures, the plurality of second transistors form at least infrared light emitting circuits, input ends of the infrared light emitting circuits are configured to receive an infrared emitting signal, output ends of the infrared light emitting circuits are connected to the second metal interconnection structures, and the infrared emitting signal is transmitted via the second metal interconnection structures to the plurality of first GaN-based LED structures in the first region.

19. A display panel with gallium nitride-based light emitting diode units with display state and infrared recognition state, comprising a display region,
wherein the display region comprises at least a first region and a second region, and the first region and the second region comprise first Gallium Nitride-based (GaN-based) light emitting diode (LED) units arranged in an array;
wherein the first region and the second region comprise a display state and an infrared recognition state; in the display state, the first GaN-based LED units in the first region and the second region are configured to display a visible light screen; in the infrared recognition state, the first GaN-based LED units in the first region are configured for emitting infrared light, and the first GaN-based LED units in the second region are configured for sensing infrared light;
wherein the display panel further comprises a substrate, wherein a plurality of second transistors are provided on the substrate, a second metal interconnection sub-layer is provided between the substrate and the first GaN-based LED units in the first region, and second metal interconnection structures of the second metal interconnection sub-layer are configured to be electrically connected to the plurality of second transistors;
wherein the substrate has a plurality of second charge storage regions, each of the first GaN-based LED units comprises a plurality of first GaN-based LED structures, and each of the first GaN-based LED structures in the first region is electrically connected to corresponding one of the plurality of second charge storage regions to store generated light-sensing charges;
wherein the plurality of second transistors form at least second light-sensing processing circuits, and the second light-sensing processing circuits sense a light-sensing electrical signal generated by the plurality of first GaN-based LED structures in the first region; wherein
when the light-sensing electrical signal sensed by the second light-sensing processing circuits from the plurality of first GaN-based LED structures in the first region is greater than a sixth threshold, the light-sensing electrical signal is stored as a blue light incidence signal;
when the light-sensing electrical signal sensed by the second light-sensing processing circuits from the plurality of first GaN-based LED structures in the first region is greater than a seventh threshold and not greater than the sixth threshold, the light-sensing electrical signal is stored as a green light incidence signal; and
when the light-sensing electrical signal sensed by the second light-sensing processing circuits from the plurality of first GaN-based LED structures in the first region is greater than an eighth threshold and not greater than the seventh threshold, the light-sensing electrical signal is stored as a red light incidence signal.

\* \* \* \* \*